United States Patent [19]

Lardennois

[11] 3,999,104
[45] Dec. 21, 1976

[54] ELECTRONIC SAFETY CIRCUITS

[75] Inventor: Regis Lardennois, Verriere Le Buisson, France

[73] Assignee: Engins Matra, Paris, France

[22] Filed: Dec. 13, 1974

[21] Appl. No.: 532,363

[30] Foreign Application Priority Data

Dec. 14, 1973 France .............................. 73.44907

[52] U.S. Cl. ................................ 317/31; 317/148; 317/18 R; 307/88 R; 321/11; 323/58; 323/48

[51] Int. Cl.² ...................... H02H 3/24; H02H 3/16

[58] Field of Search .... 317/31, 33 R, 148, 156 TR, 317/DIG. 1, DIG. 4; 307/88 R; 321/11, 14, 25, 15, 44; 323/6, 58, 48; 331/113 A

[56] References Cited

UNITED STATES PATENTS

| | | | |
|---|---|---|---|
| 2,894,180 | 7/1959 | Price | 317/148 |
| 3,182,229 | 5/1965 | Wesslund | 317/148 |
| 3,214,601 | 10/1965 | Christopherson | 317/148 |
| 3,229,112 | 1/1966 | Hagland et al. | 317/148 |
| 3,806,792 | 4/1974 | Untamo | 321/25 |

*Primary Examiner*—R. N. Envall, Jr.
*Assistant Examiner*—Patrick R. Salce
*Attorney, Agent, or Firm*—Brown, Murray, Flick & Peckham

[57] ABSTRACT

Electronic safety circuit intended to produce an output signal in the event of wearing out or failure of one of its components, the circuit comprising a magnetic circuit having a rectangular hysteresis cycle, a control circuit connected to the magnetic circuit and to the other components which are under surveillance, this control circuit acting in a balanced fashion on the magnetic circuit when all the components of the circuit under surveillance function normally, but producing an unbalanced action when at least one of these components is defective, and an output circuit producing an output signal in the event of an unbalanced action on the magnetic circuit.

1 Claim, 18 Drawing Figures

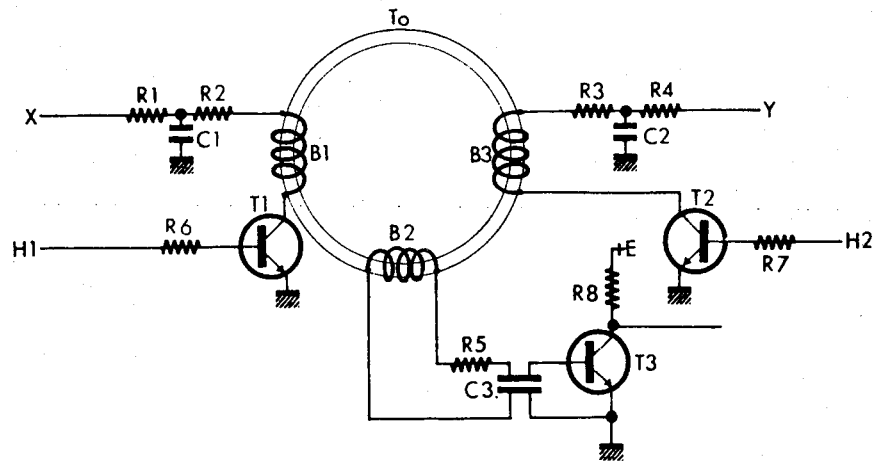
Fig_1_
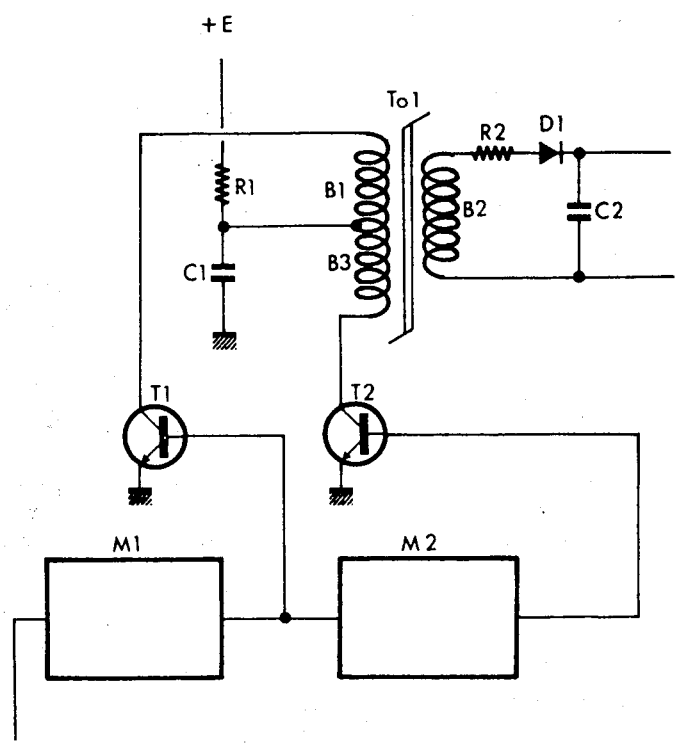
Fig_10

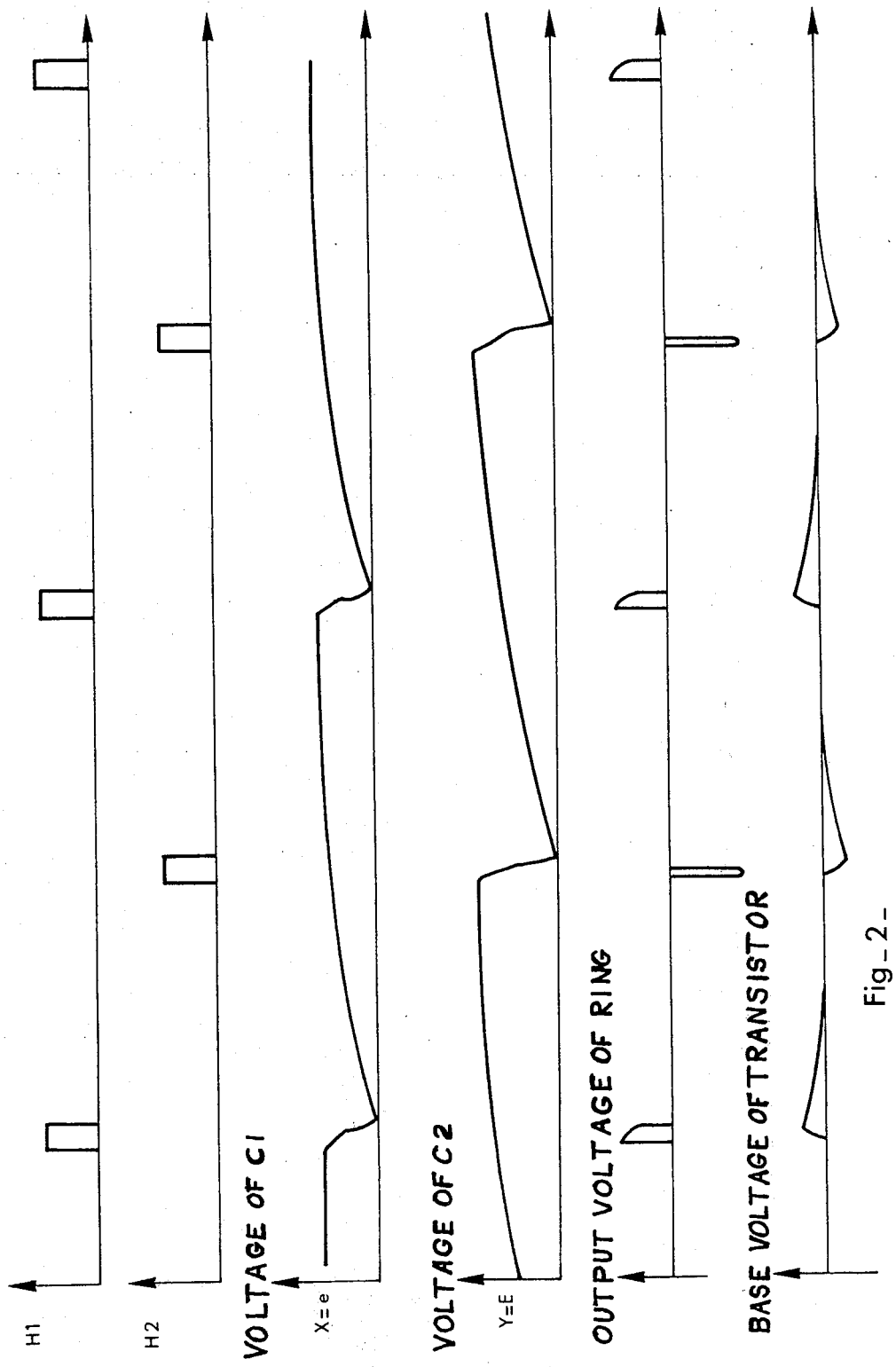
Fig_2_

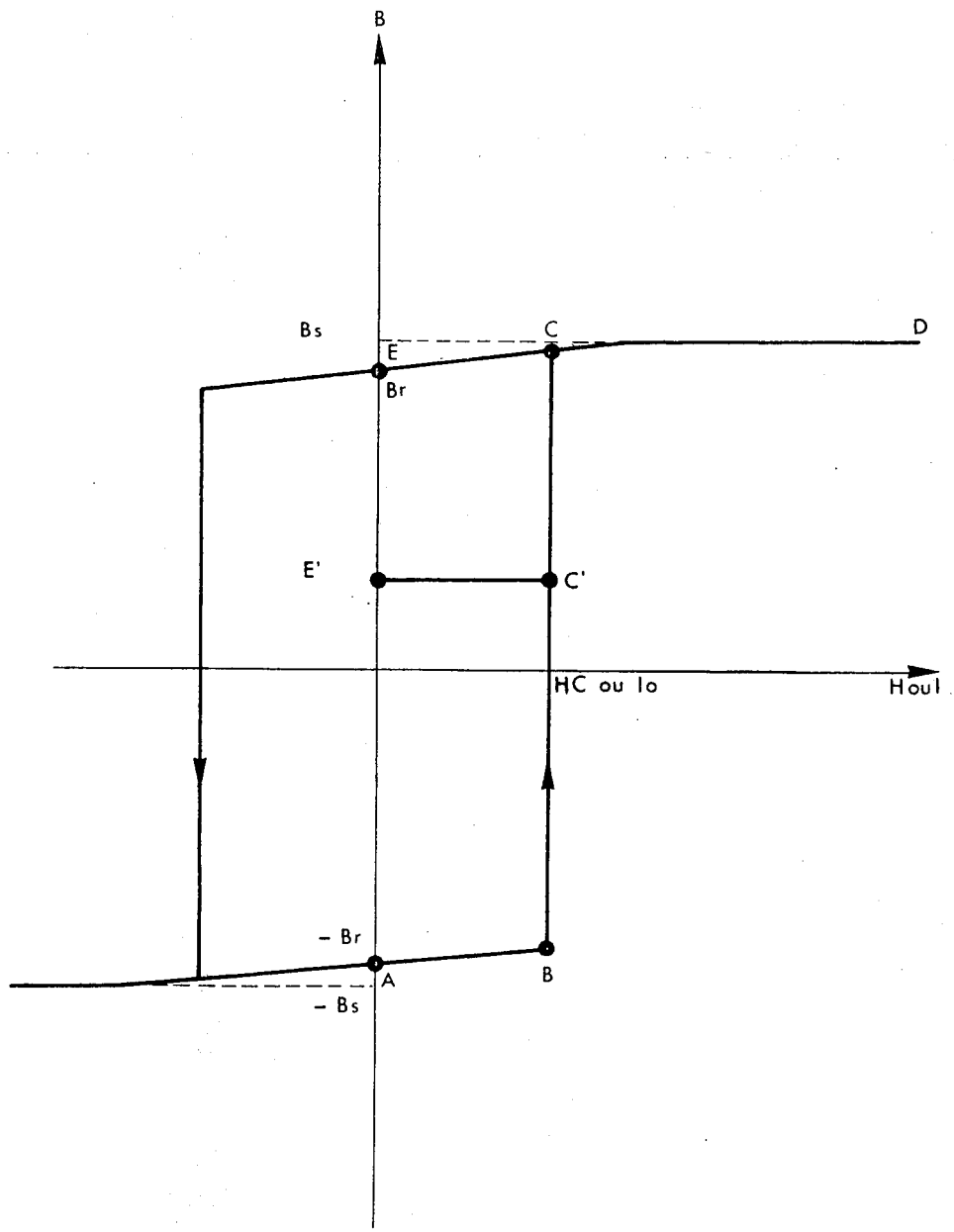
Fig_3

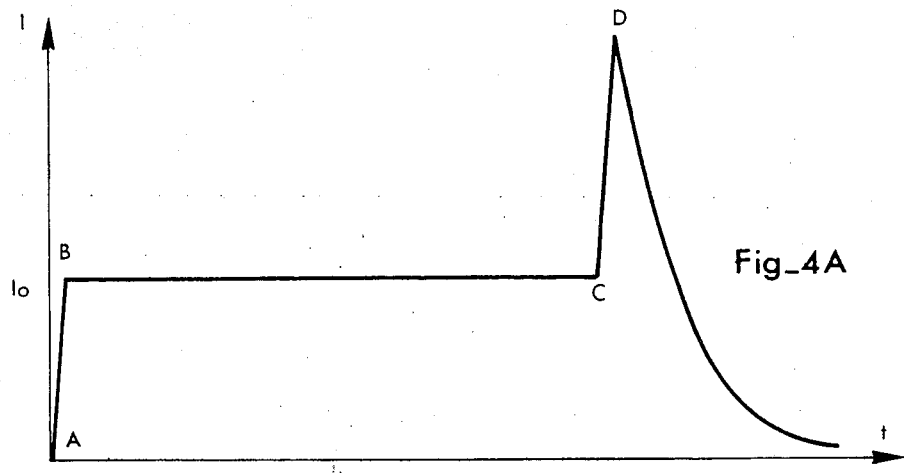
Fig_4A
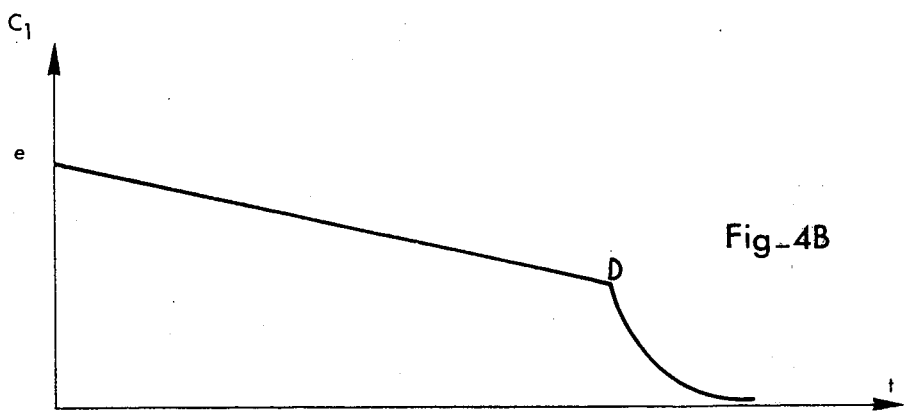
Fig_4B
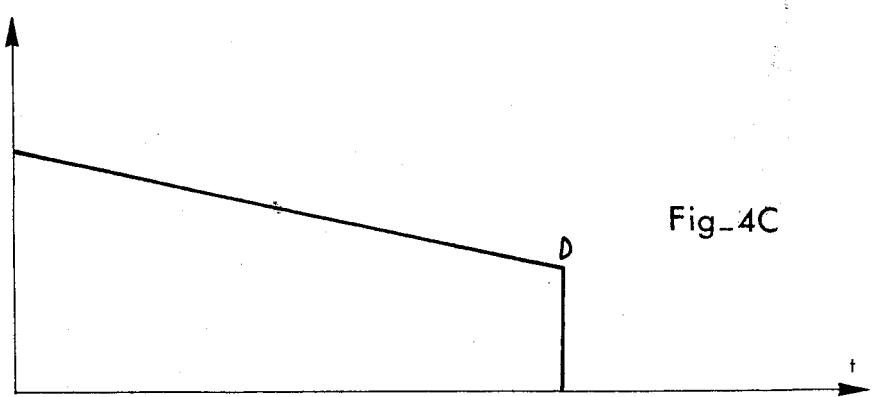
Fig_4C

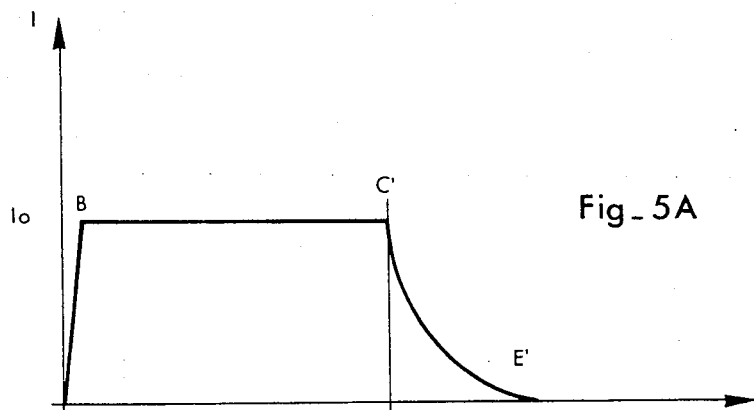
Fig_5A
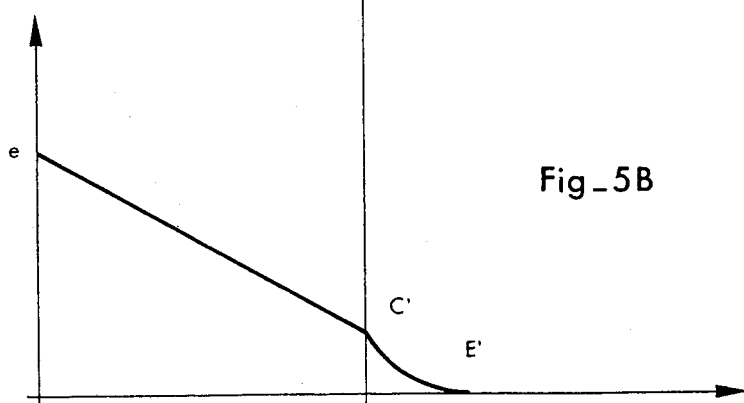
Fig_5B
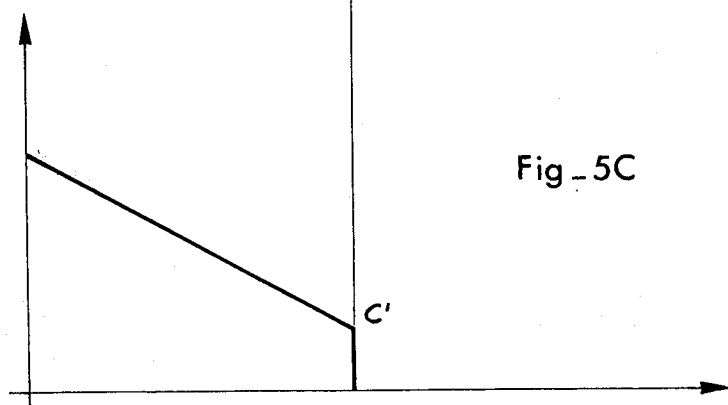
Fig_5C

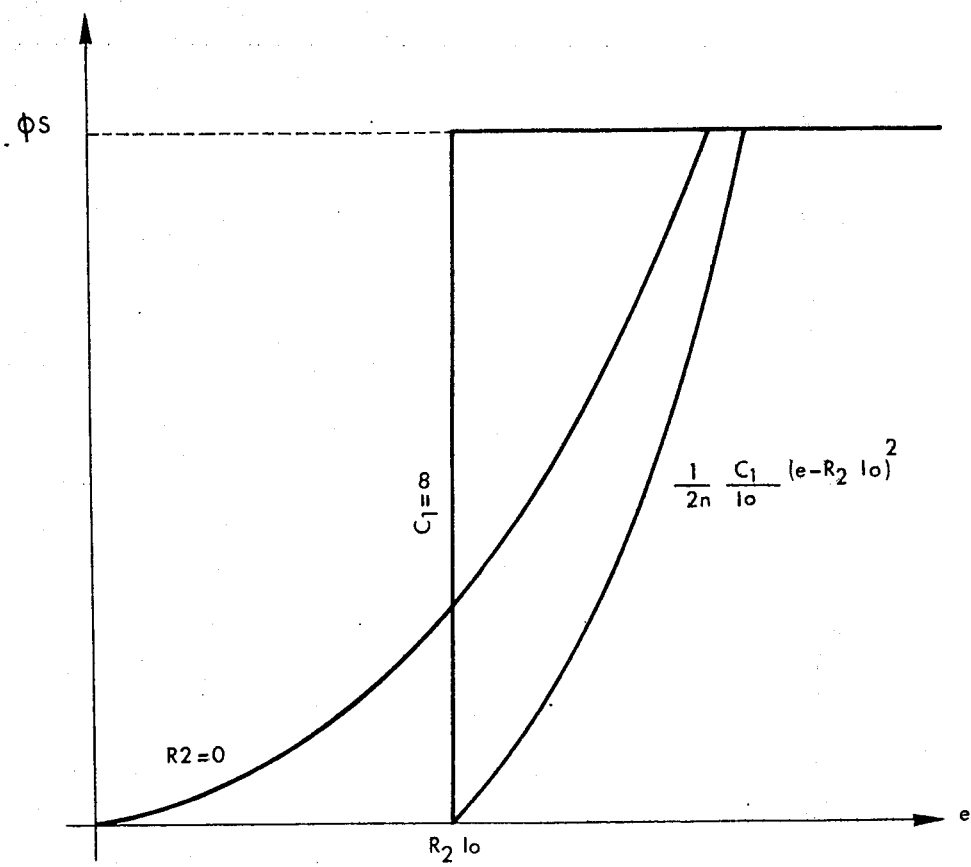
Fig_6

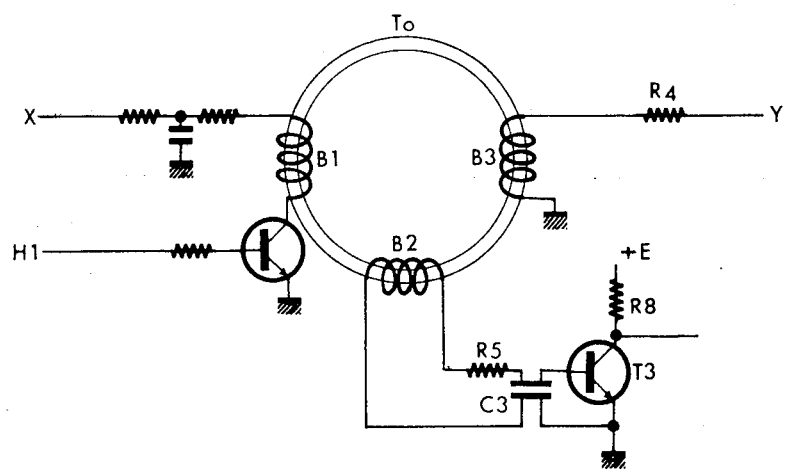
Fig_7_
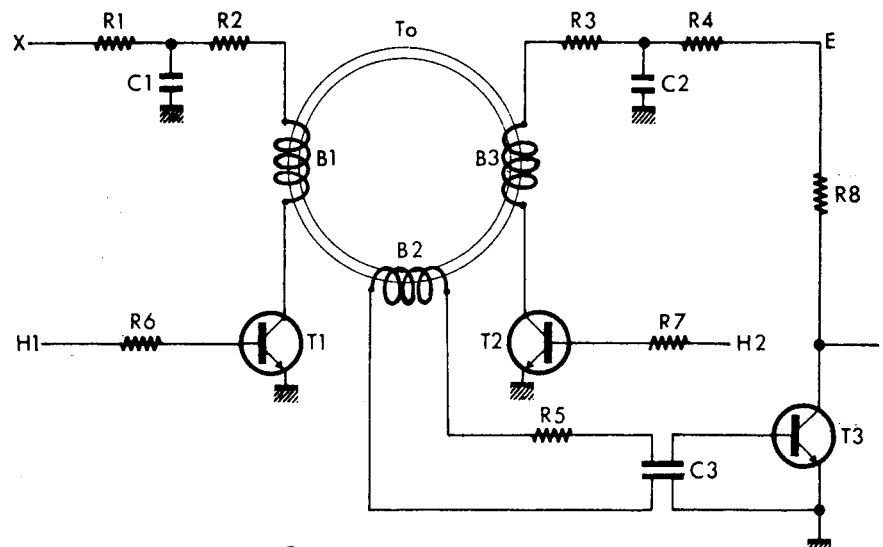
Fig_8_

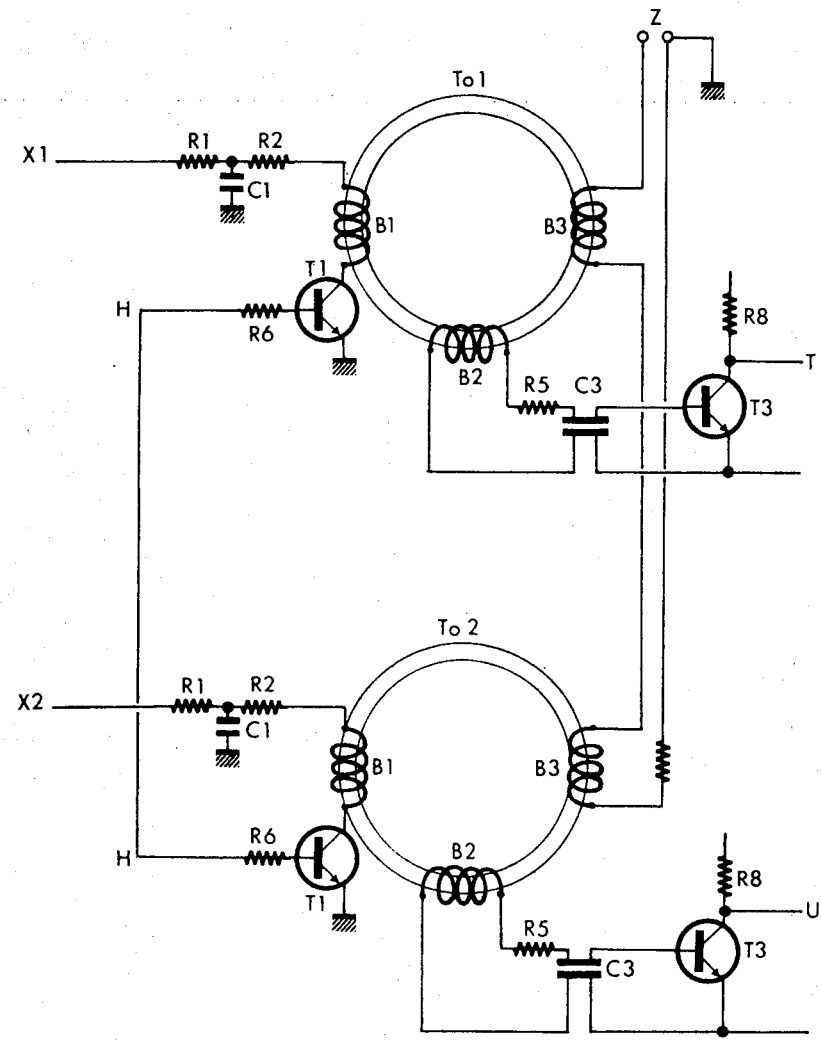
Fig_9_

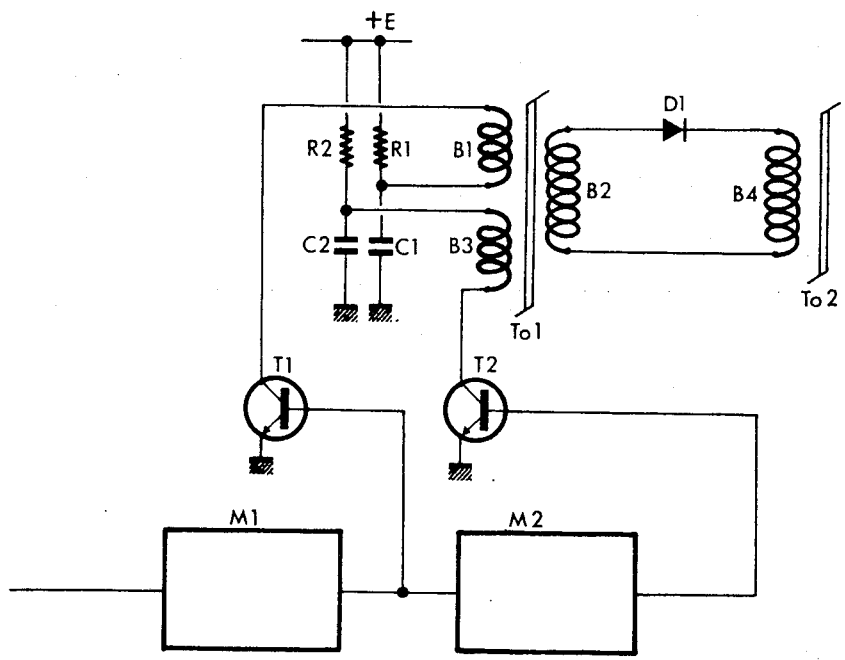
Fig_11_
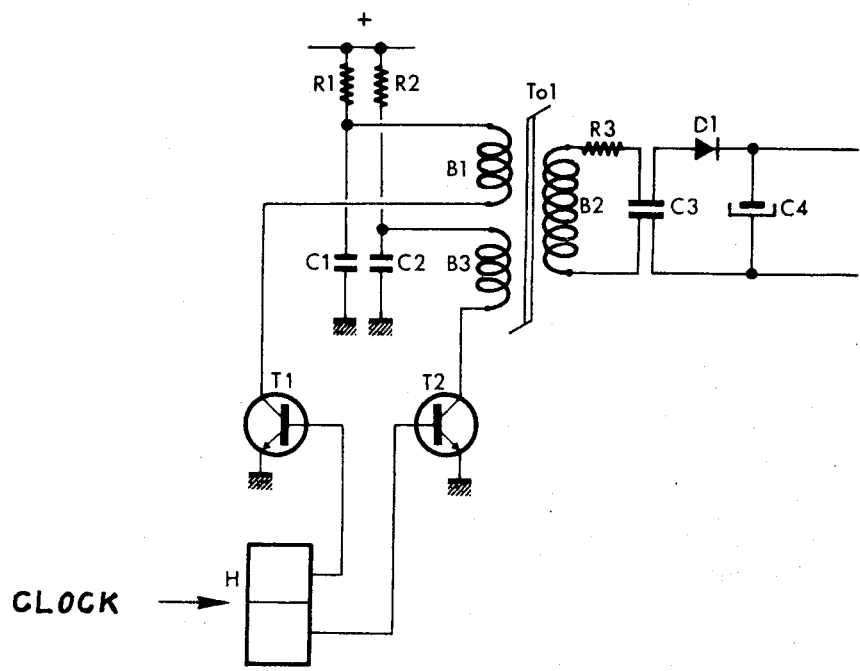
Fig_12_

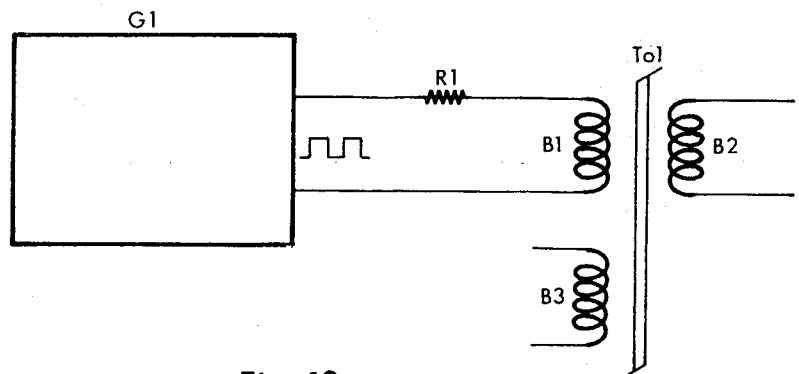
Fig_13
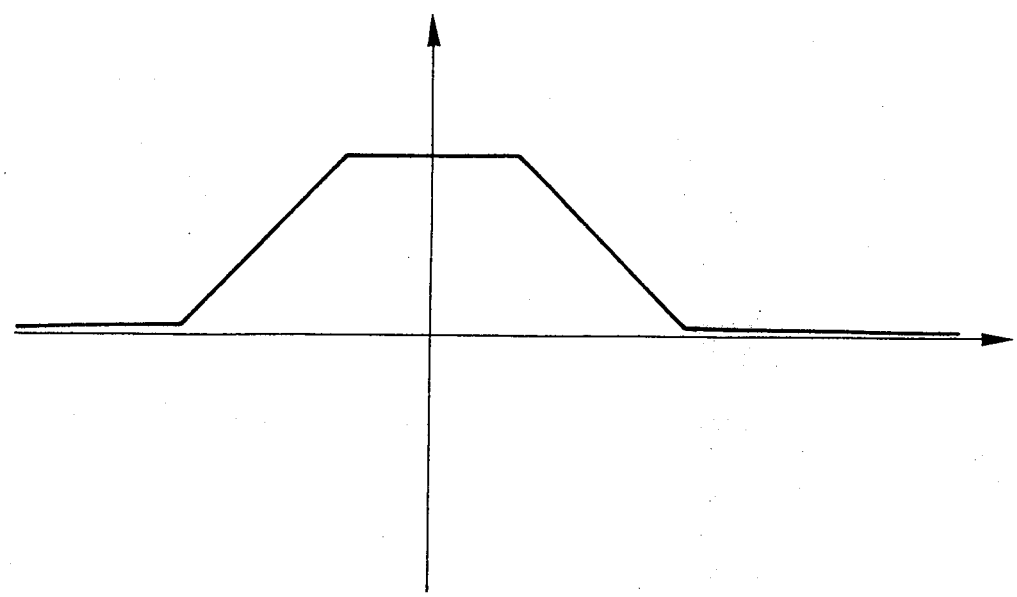
Fig_14_

ELECTRONIC SAFETY CIRCUITS

The invention relates to electronic safety circuits.

The present invention has as its object to provide circuits of inherent safety which enable a certain number of characteristics to be preserved even in the presence of faults.

It is necessary for such circuits to provide an output signal, whatever the malfunction. In such circuits, the sources of malfunction are multiple because any circuit component or any junction of two components can be a source of malfunction.

The purpose of the present invention is to provide electronic safety circuits producing an output signal whatever the state of malfunctioning to which they are subjected, that is, producing a normal output signal of high energy and a weak output signal of low energy constituting the alarm.

According to the invention there is provided an electronic safety circuit intended to produce an output signal in the event of wearing out or failure of one of its components, the circuit comprising a magnetic circuit having a rectangular hysteresis cycle, a control circuit connected to the magnetic circuit and to the other components which are under surveillance, this control circuit acting in a balanced fashion on the magnetic circuit when all the components of the circuit under surveillance function normally, but producing an unbalanced action when at least one of these components is defective, and an output circuit producing an output signal in the event of an unbalanced action on the magnetic circuit.

According to another feature of the invention, the control circuit may comprise coils saturating the magnetic circuit alternately in one sense and in the other.

According to a further feature of the invention, the control circuit may comprise two opposed coils, each connected to a circuit consisting of a condenser discharged through a discharge resistance, the coil and a transistor, and of a resistance for charging the condenser, the transistor being made conductive by an external signal.

Certain circuits function by hysteresis loss in the magnetic material and other function by saturation of the magnetic material.

The invention will be described in more detail by way of example with the aid of various embodiments shown schematically in the accompanying drawings, in which:

FIG. 1 is a general plan of a safety circuit constituting a circuit with two gated inputs;

FIG. 2 is a time diagram of the circuit according to FIG. 1;

FIG. 3 shows the hysteresis cycle of the magnetic material of the ring;

FIGS. 4A, 4B, and 4C show respectively, as a function of time, the discharge current of the condenser $C_1$, the voltage across the condenser $C_1$, and the voltage in the secondary in the case where the charge of the condenser is sufficient to saturate the ring;

FIGS. 5A, 5B, and 5C show respectively the discharge current of the condenser $C_1$, the voltage across the condenser $C_1$, and the voltage in the secondary in the case where the charge of the condenser is insufficient to saturate the ring;

FIG. 6 shows various flux curves as a function of the applied voltage $e$, in accordance with various values of the components of the circuit;

FIG. 7 is a plan of a variant of the circuit of FIG. 1 constituting a circuit one input of which is "AND gated" and the other input of which is continuous;

FIG. 8 is a circuit according to FIG. 1 set up as a threshold circuit;

FIG. 9 shows an inverter circuit composed of two rings;

FIG. 10 shows a variant of the safety circuit constituting a capacitative integrator;

FIG. 11 shows a variant of the safety circuit of FIG. 10, constituting an inductive integrator;

FIG. 12 is another variant of the circuit of FIG. 10, constituting a generator of a reference voltage;

FIG. 13 is a simplified plan of a detector of absence of current;

FIG. 14 shows the effective output voltage as a function of the control current of the detector of absence of current of FIG. 13.

According to FIG. 1, a first embodiment of the safety circuit of the invention includes a magnetic ring $T_0$ having a rectangular hysteresis cycle. A coil $B_1$ of a first control circuit is wound around the ring $T_0$. This coil is connected at one end to the input X through a charging resistance $R_1$ and a discharging resistance $R_2$ of the condenser $C_1$.

The other end of the coil $B_1$ is connected to the collector of the transistor $T_1$ whose emitter is earthed. The base of the transistor $T_1$ is connected by the resistance $R_6$ to the input of the gate $H_1$.

A second control circuit comprises a coil $B_3$ wound on the ring $T_0$. One end of this coil is connected to the input Y through a discharging resistance $R_3$ and a charging resistance $R_4$ of a condenser $C_2$. The other end of the coil $B_3$ is connected to the collector of a transistor $T_2$ whose emitter is earthed. The base of the transistor $T_2$ is connected by a resistance $R_7$ to the input of gate $H_2$.

The two coils $B_1$ and $B_3$ are wound in opposite sense on the ring $T_0$, so that the fluxes induced in the ring $T_0$ are opposed.

The output circuit comprises a coil $B_2$ wound on the ring $T_0$. This coil $B_2$ is connected to an integrator circuit formed by the resistance $R_5$ and the condenser $C_3$. One terminal of this condenser is connected to the base of the transistor $T_3$, its other terminal being earthed.

The collector of the transistor $T_3$ is connected to the supply voltage $+ E$ by the resistance $R_8$. The emitter of the transistor is earthed. The output is taken from the collector of the transistor $T_3$.

In FIG. 1, a four-terminal condenser $C_3$ has been employed. This permits the detection of open-circuiting of the connections. Such a fault is betrayed by a zero output voltage. The circuit according to FIG. 1 is a gated circuit. Actually, the command pulses $H_1$ and $H_2$ are clock pulses.

Referring particularly to the first control circuit, it can be seen that the input X charges the condenser $C_1$ through the resistance $R_1$ as long as the transistor $T_1$ is non-conductive. With the appearance of a clock pulse H1, the transistor $T_1$ becomes conductive and the condenser $C_1$ can discharge through the resistance $R_2$ and the coil $B_1$. The current I which passes through the coil $B_1$ creates a variation of flux $\Delta \Phi$ of the induction of the magnetic field in the ring $T_0$. In the same way, the condenser $C_2$ is charged by the signal Y through the resistance $R_4$. With the appearance of a clock signal $H_2$, the transistor $T_2$ becomes conducting and allows the condenser $C_2$ to discharge through the resistance $R_3$, the coil $B_3$ and the transistor $T_2$. The current which passes through the coil $B_3$ creates in the ring $T_0$ a flux variation $-\Delta\Phi'$, opposed to the flux variation $\Delta\Phi$.

The different variations of flux in the ring $T_0$ are detected by the coil $B_2$ connected to the integrating circuit $R_5$, $C_3$. The circuit gives a voltage proportional to the flux variation in the ring $T_0$. In general, a time constant $\tau = R_5$, $C_3$ is chosen which is ten times greater than the duration of the output pulses of the ring $T_0$. An output voltage is thus obtained which is given by the following formula:

$$V = \frac{n\Delta\Phi}{R_5 C_3}$$

or $$V' = \frac{n\Delta\Phi'}{R_5 C_3}$$

In this formula, n is equal to the number of turns of the coil $B_2$; $\Delta\Psi$ and $\Delta\Psi$ are the flux variations produced by the coils $B_1$ and $B_3$. Once the output voltage V reaches a sufficient value to render the transistor $T_3$ conducting, an output signal is obtained at the collector. In general, the output voltage of the integrating circuit must reach a value of between 0.6 and 0.8 volt for the transistor $T_3$ to become conducting and to provide an output pulse.

The functioning of the circuit according to FIG. 1 is represented in detail in the time diagram of FIG. 2: in this diagram, the inputs X and Y are respectively assumed fixed at voltage $e$ and E.

In this FIG. 2, there are shown the clock pulses $H_1$ and $H_2$, and the voltage of the condenser $C_1$ of the first control circuit, which depends only on the clock pulse $H_2$.

The output coil receives the output voltage of the ring, which is limited to two short pulses which are positive and negative according to whether the flux $\Delta\Phi$ or $\Delta\Phi'$ is in question.

These voltage pulses are integrated by the circuit $R_5$, $C_3$ which provides the base voltage of the transistor $T_3$. This base voltage is alternately positive and negative.

Only positive pulses render the transistor $T_3$ conductive.

FIG. 3 represents the hysteresis cycle of the magnetic ring $T_0$ of FIG. 1.

In this cycle:

$B_S$ = saturation induction $B_R$ = remanent induction.

Supposing that the condenser $C_1$ is discharged, the ring $T_0$ is then in a state corresponding to the point A. At the commencement of the discharge, the current passes instantaneously from the value zero to the value $I_0$ corresponding to the coercive field (point B). Next, the state of the core passes from B to C, the current remaining at the value $I_0$. From C, the point of operation passes rapidly to the point D. After that, the operating point passes from D to E. During the discharge of the condenser $C_2$, the point of operation follows the second half of the hysteresis cycle, then returns to the point A. In the above description of the cycle, it has been supposed that the capacity of the condensers $C_1$ and $C_2$ was sufficient to saturate the ring. This corresponds to the curves of FIGS. 4A, 4B, 4C. On the other hand, if this capacity is insufficient, the point of operation passes to C' and E' (FIG. 3).

The operation of the circuit of FIG. 1 may be explained as follows. Assume that $C_1$ has been fully charged by the constant voltage $e$ and that the magnetic core $T_0$ is magnetized in the reverse direction relative to $C_1$. If a clock pulse is now applied at $H_1$, transistor $T_1$ is made conductive and $C_1$ discharges to ground as shown in FIG. 2. The discharge current rises to the value at point B of FIGS. 3 and 4A, being limited by the relatively high impedance of winding $B_1$. The flux due to this current opposes the prior magnetization of the core and drives it to saturation in the opposite direction (point B to point C, FIG. 3). When saturation is reached, the impedance of $B_1$ drops to essentially zero and the discharge current momentarily rises to a value such as that of point D, limited by the resistance $R_2$, and the current and voltage of $C_1$ decay exponentially to zero (FIGS. 4A and 4B). The clock pulse can then be terminated. The rapid change in flux in the core results in an output voltage in the output winding $B_2$ which drops to zero when saturation of the core is reached (FIG. 4C). When a clock pulse is now applied at $H_2$, transistor $T_2$ is made conductive and $C_2$ discharges through winding $B_3$. Sine $B_1$ and $B_3$ are wound in opposition, this again reverses the flux in the core and drives it to saturation in the original direction (point A in FIG. 3). The clock pulses are repeated continuously, alternating between $H_1$ and $H_2$, as shown in FIG. 2, and under normal conditions, the core is thus driven back and forth from saturation in one direction to saturation in the opposite direction.

This balanced operation results in successive output voltage pulses of opposite polarity in the winding $B_2$ (FIG. 2) which are applied to the integrating circuit $R_5$, $C_3$. The voltage applied to the integrating circuit in each pulse charges $C_3$ to a voltage determined by the magnitude of the output voltage of $B_2$ and its duration. The voltage of $C_3$ is applied to the base of transistor $T_3$ and fires $T_3$ when the voltage reaches the necessary value. Under normal conditions, with the core driven to saturation in both directions, as described above, the output voltage pulses will be as shown in FIG. 4C and of long enough duration for the voltage of $C_3$ to reach the necessary value and $T_3$ is fired on each positive voltage pulse to provide the desired signal that the circuit is functioning properly. If there is a failure of malfunction, however, the balanced operation is disturbed. For example, if the voltage E at the input Y falls to zero or to a value below normal, the capacitor $C_2$ will remain uncharged, or will be only partially charged, and when $T_2$ is made conductive, the magnetization of the core will not be reversed but will remain in its previous state, or be only partially demagnetized (point E or E' of FIG. 3). When $T_1$ is then made conductive by the next clock pulse, the discharge current of $C_1$ drives the core to saturation in a shorter time (FIG. 5A) and the output voltage of winding $B_2$ falls to zero in the same reduced time (FIG. 5C), or may be of only momentary duration if the voltage at Y is zero. Under these circumstances, with an abnormally short output voltage pulse, the voltage of $C_3$ will not reach the necessary value to fire $T_3$ and no final output signal occurs, indicating a failure or malfunction. It will be seen that any failure of any part or component which prevents the occurrence of output voltage pulses of normal duration will thus be indicated.

FIG. 6 is a plan showing the flux $\Phi$ as a function of the input signal e, for different parameters of the circuit.

These curves are obtained by mathematical analysis of the circuits.

Actually, the flux variation is equal to the integral of the back e.m.f. of the ring:

$$n \Delta \Phi = 0 \text{ if } e < R_2 I_0$$

$$n\Delta\Phi = \int_A^{C \text{ or } C'} (V - R_2 I_0) dt$$

In these formulae, V is the instantaneous voltage of the condenser $C_1$.

Now, $$V = e - \frac{T}{C} I_0$$

(formula for the discharge of a condenser at constant current).

At the point C, we have
$V = R_2 I_0$ ($I_0$ current corresponding to the coercive field B).

Substituting these values in the above formulae, we obtain:

$$n\Delta\Phi = \frac{1}{2} \frac{C}{I_0} (e - R_2 I_0)^2$$

Now, the flux variation is limited by the saturation flux $\Phi$ S.

For various values of the parameters $R_2$ and $C_1$, we obtain the curves shown in FIG. 6.

FIG. 7 is a variant of the circuit of FIG. 1.

For the description of this variant, the same reference numerals as in FIG. 1 have been used for identical components.

In this variant, the second control circuit is a non-gated circuit.

Actually, the input Y is connected directly by the resistance $R_4$ to the coil $B_3$ wound around the ring $T_0$.

Under normal conditions, a constant current flows through the winding $B_3$. When a clock pulse is applied to $H_1$, a capacitor discharge current flows through $B_1$, as previously described, driving the core to saturation in the reverse direction and generating an output voltage pulse in $B_2$. After termination of the discharge current, the continuous current in winding $B_3$ provides a flux which again reverses the magnetization of the core and drives it to saturation in this direction. Since only the positive output voltage pulses are effective to fire transistor $T_3$, the negative pulses are not important and the continuous current in winding $B_3$ can be such that the rate of change of flux in the core is relatively slow, so long as saturation is reached before the next pulse on $H_1$. It will be seen that the operation of this embodiment of the invention is essentially the same as the previous one, but it is somewhat simpler and less expensive.

FIG. 8 shows a variant of the circuit of FIG. 1 constituting a ring threshold circuit. This circuit is distinguished from the circuit of FIG. 1 by the employment of a reference voltage applied to the input Y. This reference voltage may be for example the supply voltage + E.

FIG. 9 represents a variant of FIGS. 1 and 7. This apparatus constitutes an inverter. It comprises a first circuit part (upper part) formed of a first ring $T_{01}$ whose output $X_1$ of the control circuit is connected to the coil $B_1$ by the charging resistance $R_1$ and the discharging resistance $R_2$ of the condenser $C_1$.

The output of the coil $B_1$ is connected to the collector of a transistor $T_1$ whose emitter is earthed. The base of the transistor $T_1$ receives clock pulses H through the resistance $R_6$.

The ring $T_{01}$ is also provided with a winding $B_3$ forming part of a second control circuit. This winding $B_3$ is connected to the input Z. The winding $B_3$ is mounted in series with a winding ($-B_3$) wound oppositely provided on the second ring $T_{02}$.

Finally, this first ring $T_{01}$ comprises an output circuit formed by the coil $B_2$, the integrator circuit $R_5$, $C_3$ and the transistor $T_3$ whose collector is connected to the supply by the resistance $R_8$.

This output circuit provides an output signal T.

The second part of the circuit of FIG. 9 is analogous to the first part. It comprises a ring $T_{02}$, and a first control circuit having an input $X_2$ and receiving the same clock pulses as the first control circuit of the ring $T_{01}$.

The output circuit of the ring $T_{02}$ is identical with the output circuit of the ring $T_{01}$. The output of the ring $T_{02}$ provides the signal U. The second control circuit of the ring $T_{02}$ is formed by the coil $B_3$ of the ring $T_{01}$. These two coils are connected at the common input Z.

The input Z serves for continuous control (i.e. non-gated) of the two rings $T_{01}$, $T_{02}$.

The inverter circuit, according to FIG. 9 enables the following functions to be achieved with security.

In this circuit, positive voltage may be applied to $X_1$ and $X_2$ and either a positive or negative signal at Z. It will be seen that each part of the circuit is similar to the circuit of FIG. 7 but that, since the windings $B_3$ of the two cores are in opposition, one part or the other will be inoperative depending on the polarity of the signal Z. It will also be apparent that no output can occur if there are no voltages at $X_1$ and $X_2$. The circuit of FIG. 9, therefore, will reliably indicate the applied voltage signals. That is, if there is a voltage at $X_1$ and the voltage at Z is positive, an output signal will occur only at T. If there is a voltage at $X_2$ and the voltge at Z is negative, there will be an output signal only at U.

Finally, in the different circuits above, the output signals have the frequency of the clock signals.

The variant of the safety circuit according to FIG. 10 comprises a magnetic ring $T_{01}$ having a rectangular hysteresis cycle. This magnetic ring cooperates with two control circuits and an output circuit.

The first control circuit comprises the coil $B_1$ one of whose terminals is connected to the point of junction of the charging resistance $R_1$ of the condenser $C_1$ while the other side of this coil $B_1$ is connected to the collector of the transistor $T_1$, whose emitter is earthed. The base of the transistor $T_1$ is controlled by the monostable $M_1$ which is itself controlled by the input by the delivery of pulses. The condenser $C_1$ is connected by the charging resistance $R_1$ to the supply voltage + E. The second terminal of condenser $C_1$ is earthed. The second control circuit comprises the coil $B_3$ cooperating with the ring $T_{01}$. One side of the coil $B_3$ is connected as the corresponding side of the coil $B_1$ to the point of junction of the resistance $R_1$ and the condenser $C_1$. The other side of the coil $B_3$ is connected to the collector of transistor $T_2$, whose emitter is earthed and whose base is controlled by the monostable $M_2$, itself connected to the monostable $M_1$ and thence to the input.

The coils $B_1$ and $B_3$ are provided in opposed sense on the ring $T_{01}$. The control circuit consists of the coil $B_2$ connected to the capacitative integrator $R_2C_2$ including a diode $D_1$.

The transistors $T_1$ and $T_2$ rendered conductive respectively by the monostables $M_1$ and $M_2$ discharge the condenser $C_1$ into the coils $B_1$ and $B_3$, saturating the ring alternately in one state and in the other. For each reversal of the ring, we have an output signal corresponding to the magnetic saturation flux.

All faults of this circuit cause a reduction of the charge of the condenser $C_1$. There is therefore security in respect of the type of fault considered.

FIG. 11 represents a variant of the apparatus of FIG. 10. This safety circuit is a ring integrator. It is composed of a first ring $T_{01}$ having two distinct control circuits. The first control circuit consists of the coil $B_1$ and the condenser $C_1$ connected to the supply voltage by the resistance $R_1$. The second control circuit consists of the coil $B_3$ and the condenser $C_2$ connected to the supply voltage by the resistance $R_2$. These two coils $B_1$ and $B_3$, provided on the ring $T_0$, cooperate with the output coil $B_3$, itself linked through the diode $D_1$ to a coil $B_4$ connected to the ring $T_{02}$, itself provided with an output coil.

Discharge of the condensers, $C_1$ and $C_2$ occurs when the transistors $T_1$ and $T_2$ are made to conduct. The base of each transistor $T_1$, $T_2$ is connected to a monostable $M_1$, $M_2$. These are connected to a common input.

For each input pulse, the ring $T_{01}$ is saturated in one state and then in another by the successive rendering conductive of the transistors $T_1$ and $T_2$.

We obtain an output signal which is transmitted to the ring $T_{02}$. The coupling of the rings $T_{01}$ and $T_{02}$ enables variations in flux between the two rings to be equalised, thanks to the diode $D_1$.

In this circuit, the total quantity of flux variations of the ring $T_{02}$ is measured by returning it to its initial state and determining the flux of the output signal. This circuit is analogous to those described above and is not shown.

FIG. 12 shows a variant of the circuit of FIG. 10, forming a generator of a reference voltage into a safety circuit.

This circuit can also be considered as a variant of the safety circuit of FIG. 11. Actually, it is distinguished from this latter only by the outlet circuit comprising a coil $B_2$ on the ring $T_{01}$. This coil is connected to the integrating circuit $R_3C_3$ which gives a voltage which increases proportionally to the flux of the magnetic circuit $T_{01}$. The increasing voltage is detected by the detector formed of the diode $D_1$ and the condenser $C_4$.

The transistors $T_1$ and $T_2$ of the two control circuits $B_1$, $C_1$, $R_1$ and $B_3$, $C_2$, $R_2$ are controlled by a clock H. The frequency of this clock has practically no influence on the output voltage received by the detector $D_1$, $C_4$, but only on the internal resistance of the source. Such a generator of a reference voltage can only provide weak currents of the order of some micro-amperes.

FIG. 13 shows a variant of the foregoing circuits, constituting a detector of absence of current in a conductor. The current whose absence is to be detedted passes through the coil $B_3$ wound around the ring $T_{01}$. Another control circuit is formed by the coil $B_1$ on the ring $T_{01}$. This coil $B_1$ is connected to a square-wave generator $G_1$ by a resistance $R_1$.

The output circuit chiefly comprises the coil $B_2$, the other components not being shown.

In this circuit, when the control current passing through the coil $B_3$ is sufficient to saturate the ring $T_{01}$, this latter stays saturated in spite of the alternating exciting field provided by the coil $B_1$. The output signal is a zero voltage. On the other hand, as soon as the control current of the coil $B_3$ disappears, the square-wave signals passing into the coil $B_1$ create an alternating field which produces an output signal.

The exciting alternating field can be regulated by the resistance $R_1$. Such a safety circuit can be used for example for the detection of the supply current of a motor such as a propulsion motor of a vehicle. It makes it possible to ensure with certainty that for example the motor is not operated when the brake is applied.

FIG. 14 shows the output voltage of the circuit of FIG. 13 as a function of the control current passing through the coil $B_3$.

Of course, the invention is not limited to the embodiments described and shown above, apart from which other modes and other embodiments can be envisaged, without departing from the invention.

What I claim is:

1. A control circuit for detecting an electrical failure or malfunction, said circuit comprising a magnetic core having a rectangular hysteresis loop, first and second input windings on said core disposed to magnetize the core in opposite directions, means for applying input voltages to said windings, control means associated with said first input winding for causing current derived from the corresponding input voltage to flow intermittently through the first winding at timed intervals, means for applying another input voltage directly to the second input winding to cause current to flow continuously therethrough, to repetitively magnetize the core alternately in opposite directions, at least the first winding driving the core to saturation in one direction, an output winding on the core for producing output voltage pulses, means for applying said output voltage pulses to an integrating circuit, said integrating circuit being adapted to respond to the duration of the voltage pulses and to provide an indication if the magnetic core is not driven to saturation in both directions of magnetization, a second substantially identical control circuit, means for connecting the control means of the first input windings of both circuits so that current flows simultaneously through both first input windings, and means for connecting the second input windings of both circuits in series relation in opposition to each other for connection to a reversible signal voltage.

* * * * *